United States Patent
Kobayashi

[11] Patent Number: 6,101,711
[45] Date of Patent: Aug. 15, 2000

[54] METHOD FOR REDUCING ELECTROMAGNETIC WAVES RADIATED FROM ELECTRONIC DEVICE

[75] Inventor: Satoshi Kobayashi, Tokyo, Japan

[73] Assignee: Advantest Corporation, Tokyo, Japan

[21] Appl. No.: 09/147,365

[22] PCT Filed: May 19, 1997

[86] PCT No.: PCT/JP97/01665
    § 371 Date: Dec. 9, 1998
    § 102(e) Date: Dec. 9, 1998

[87] PCT Pub. No.: WO97/48262
    PCT Pub. Date: Dec. 18, 1997

[30] Foreign Application Priority Data

Jun. 11, 1996 [JP] Japan .................................. 8-149344
Apr. 18, 1997 [JP] Japan .................................. 9-101873

[51] Int. Cl.[7] .................................................. H01R 43/00
[52] U.S. Cl. ................................. 29/854; 29/825; 29/828
[58] Field of Search ........................... 29/825, 826, 854, 29/831, 828

[56] References Cited

FOREIGN PATENT DOCUMENTS

| 200513 | 11/1986 | European Pat. Off. . |
| 3-245597 | 11/1991 | Japan . |
| 4-259516 | 9/1992 | Japan . |
| 8-236968 | 9/1996 | Japan . |

Primary Examiner—Carl J. Arbes
Attorney, Agent, or Firm—Oblon, Spivak, McClelland, Maier & Neustadt, P.C.

[57] ABSTRACT

A method of reducing electromagnetic radiation through an opening for cables for an electronic device and a peripheral employs an electromagnetic radiation shield which is capable of effectively shielding electromagnetic radiation easily regardless of the number of cables and which can easily be attached and removed. A soft, electrically conductive electromagnetic radiation shield cloth is disposed in fully covering relation to an opening defined in a cabinet to allow cables to be connected to terminals of an electronic device unit. The electrically conductive cloth is attached in an electrically conductive fashion to the shielded cabinet so as to be openable and closable with respect to opening. The electrically conductive cloth has a plurality of vertical slits defined therein for passage of the cables therethrough, with a lower side of the electrically conductive cloth being a free end. A plurality of electrically conductive cloths may be superposed and attached, and the lower free end of the electrically conductive cloth may have a vertical length long enough to wrap the cables pass through the slits.

17 Claims, 3 Drawing Sheets

METHOD FOR REDUCING ELECTROMAGNETIC WAVES RADIATED FROM ELECTRONIC DEVICE

BACKGROUND OF THE INVENTION

The present invention relates to a method of reducing electromagnetic radiation from an electronic device.

DISCUSSION OF THE BACKGROUND

One conventional form of connection between an electronic device unit and a peripheral of an electronic device is shown in FIG. 4 of the accompanying drawings. FIG. 4 is a schematic perspective view of the conventional electronic device and its connected state. The electronic device has an electronic device unit 41 having a cabinet 41a and a cable connection opening 42, a peripheral 43 having a cabinet 43a, and cables 44.

The electronic device is composed of the electronic device unit 41 and the peripheral 43 which are interconnected by the cables 44. The cables 44 are connected to terminals of the electronic device unit 41 through the opening 42 defined in a lower portion of the cabinet 41a.

The electronic device unit 41, the peripheral 43, and the cables 44 are shielded to prevent electromagnetic radiation generated from internal units of the electronic device unit 41 and the peripheral 43 from affecting the surroundings of the system.

Heretofore, since the number of cables 44 is small and the area of the opening 42 is not large, any effect that electromagnetic noise radiated through the opening 42 has on surroundings is not significant. However, as modern electronic devices have complicated functions, more electromagnetic radiation is generated, the number of cables 44 is increased, and the area of the opening 42 is also increased. Consequently, the intensity of electromagnetic radiation radiated from the opening 42 in the cabinet 41a tends to exceed limit values of various noises.

Attempts have been made to attach a plate or a ventilator as a shield over the opening 42. However, such a plate or a ventilator may not be attached because too many cables are used, or may not provide a sufficient shielding capability.

SUMMARY OF THE INVENTION

It is an object of the present invention to provide a method of reducing electromagnetic radiation through an opening for cables for an electronic device and a peripheral with an electromagnetic radiation shield which is capable of effectively shielding electromagnetic radiation easily regardless of the number of cables and which can easily be attached and removed.

According to the present invention, there is provided a method of reducing electromagnetic radiation emitted outwardly from an electronic device including an electronic device unit, a peripheral thereof, and a plurality of cables electrically interconnecting the electronic device unit and the peripheral. According to this method, a cabinet of the electronic device unit, a cabinet of the peripheral, and the cables are shielded, and a soft cloth-like electromagnetic radiation shield is placed in a covering relation to an opening defined in the cabinet to allow the cables to be connected to terminals of the electronic device unit. The electromagnetic radiation shield is attached in an electrically conductive fashion to the cabinet so as to be openable and closable with respect to the opening.

The cloth-like electromagnetic radiation shield preferably has a plurality of vertical slits defined therein for passage of the cables therethrough, with a lower side of the electromagnetic radiation shield being a free end. A plurality of the cloth-like electromagnetic radiation shields may be superposed and attached. The free end of the cloth-like electromagnetic radiation shield, which is divided by the slits, may have a vertical length long enough to wrap the cables near portions thereof which pass through the slits.

The cloth-like electromagnetic radiation shield may be made of electrically conductive fibers, or electrically conductive resin, or electrically conductive rubber.

Since the opening in the cabinet of the electronic device unit is covered by the electromagnetic radiation shield which is soft, cloth-like, and electrically conductive and attached in an electrically conductive fashion to the cabinet, the cables may be passed through the opening at any spot without removal of the electromagnetic radiation shield. The electromagnetic radiation shield may have vertical slits, may be provided as plural electromagnetic radiation shields, and may have its skirt elongated to wrap the cables for reducing open cracks between the electromagnetic radiation shield and the cables for an increased shielding capability. Therefore, because the electromagnetic radiation shield means can increase the electromagnetic radiation shielding capability regardless of the number of the cables, the electromagnetic radiation shield means may be constructed as a general-purpose product, and may be attached and removed with ease.

According to another embodiment of the present invention, the cabinet of the electronic device unit, the cabinet of the peripheral, and the cables are shielded, and an electrically conductive material which is plastic at normal temperature is filled in the form of a sheet in open cracks between the cables inserted in an opening defined in the cabinet to allow the cables to be connected to terminals of the electronic device and the cabinet surrounding the opening.

Inasmuch as the open cracks between the cabinet surrounding the opening and the cables are filled with the electrically conductive material which is plastic at normal temperature, such as resin, in the form of a sheet, electromagnetic radiation emitted from within the cabinet through the opening is reduced regardless of the number of the cables. Since the filled material is plastic at normal temperature, it can easily be removed and filled again when the cables are removed and installed.

The method of reducing electromagnetic radiation can also effectively be applied to a semiconductor testing device.

BEST MODE FOR CARRYING OUT THE INVENTION

Figure 1A:
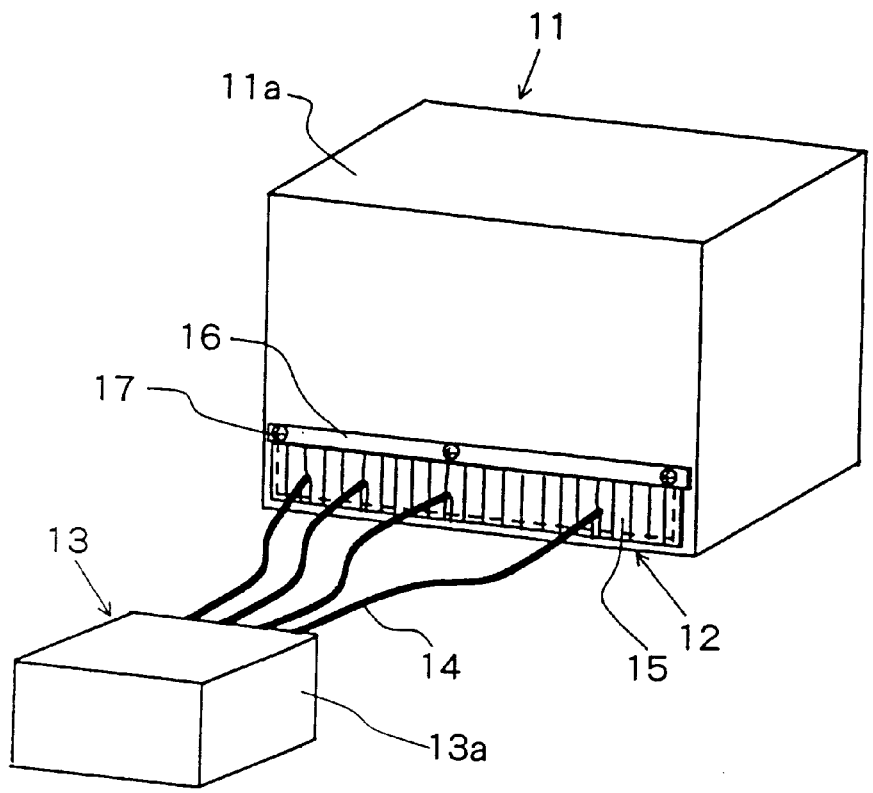
FIG. 1A is a schematic perspective view showing an electronic device unit, a peripheral, and a connected state therebetween, of an electronic device according to a first embodiment of the present invention.
Figure 1B:
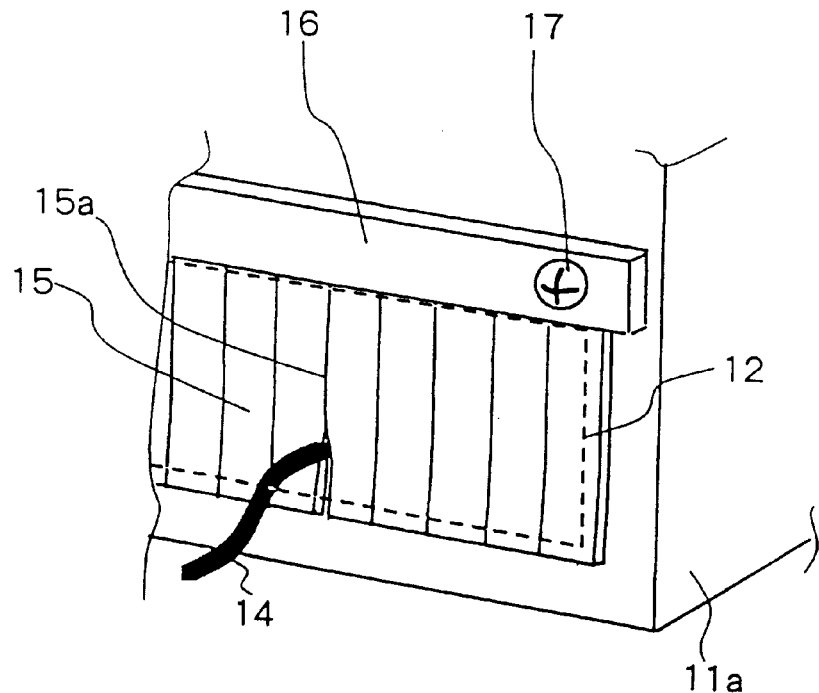
FIG. 1B is an enlarged fragmentary perspective view of an opening in the electronic device unit according to the first embodiment of the present invention.

Embodiments of the present invention will be described below. FIG. 1A is a schematic perspective view showing an electronic device unit, a peripheral, and a connected state therebetween, of an electronic device according to a first embodiment of the present invention, and FIG. 1B is an enlarged fragmentary perspective view of an opening in the electronic device unit according to the first embodiment of the present invention.

The electronic device has an electronic device unit 11 having a cabinet 11a which has an opening 12, a peripheral 13 having a cabinet 13a, cables 14, an electrically conductive cloth 15 having slits 15a, a shield plate 16, and mounting screws 17.

According to the first embodiment, the electronic device is composed of the electronic device unit 11 and the peripheral 13 which are interconnected by the cables 14. The cables 14 are connected to terminals of the electronic device unit 11 through the opening 12 defined in a lower portion of the cabinet 11a and having an electromagnetic radiation shield means for the cabinet 11a. The electronic device unit 11, the peripheral 13, and the cables 14 are shielded by a technology that has already been practiced, for preventing electromagnetic radiation generated from internal units of the electronic device unit 11 affecting surroundings of the system.

The electromagnetic radiation shield means comprises an electrically conductive cloth 15 made of electrically conductive fibers such as carbon fibers or the like and having a number of slits 15a, an electrically conductive shield plate 16 pressing the electrically conductive cloth 15 against the cabinet 11a which is electrically conductive, and mounting screws 17 by which the shield plate 16 is fastened to the cabinet 11a. The electrically conductive cloth 15 has a size large enough to fully cover the opening 12, and is clamped by the shield plate 16 pressed against the cabinet 11a by the mounting screws 17 and fixed in an electrically conductive fashion to the cabinet 11a which is electrically conductive.

The cables 14 extend through the slits 15a in the electrically conductive cloth 15, and are connected to the terminals of the electronic device unit 11. Since the electrically conductive cloth 15 is a piece of fabric having the slits 15a, it allows the cables 14 to pass therethrough at any spot. The electrically conductive cloth 15 covers almost all the opening 12, it can block electromagnetic radiation substantially in its entirety which is emitted from within the electronic device unit 11.

Figure 2:
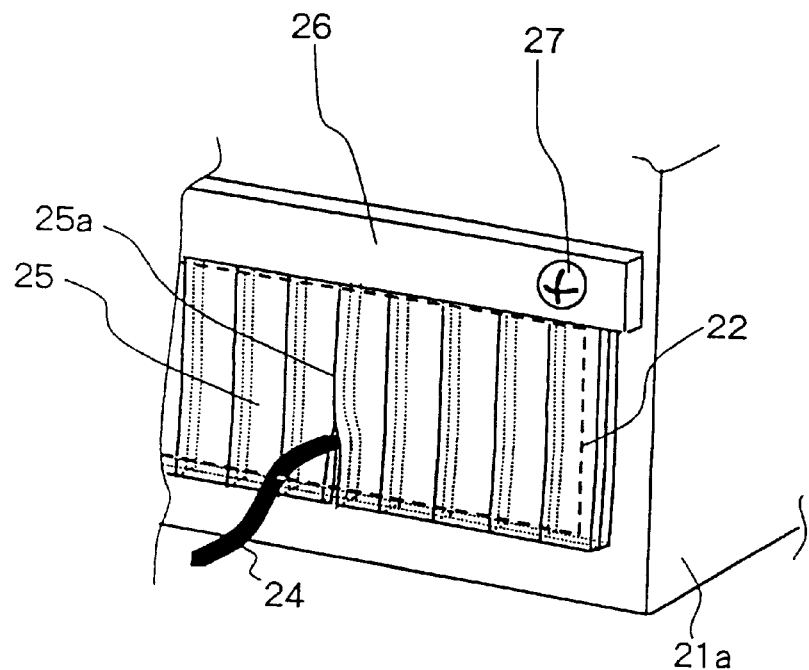
FIG. 2 is an enlarged fragmentary perspective view of an opening in an electronic device unit according to a second embodiment of the present invention.

FIG. 2 is an enlarged fragmentary perspective view of an opening in an electronic device unit according to a second embodiment of the present invention. The electronic device has a cabinet 21a has an opening 22, cables 24, electrically conductive cloths 25 having slits 25a, a shield plate 26, and mounting screws 27.

While only one electrically conductive cloth is employed in the first embodiment, there are two electrically conductive cloths 25 according to the second embodiment. The plural electrically conductive cloths 25 can reduce open cracks produced by passing the cables 26 therethrough for thereby improving a shielding capability. In FIG. 2, the slits 25a in the electrically conductive cloths 25 are aligned with each other. However, the slits 25a in the electrically conductive cloths 25 may be in different positions.

According to a third embodiment of the present invention, the electrically conductive cloth with the slits according to the first and second embodiments shown in FIGS. 1A, 1B, and 2 has a skirt section elongated to wrap the cables passing through the slits for thereby reducing open cracks between the electrically conductive cloth and the cables to further reduce the outward emission of electromagnetic radiation from within the cabinet.

In the above embodiments, the electromagnetic radiation shield means employs the electrically conductive cloth or cloths. However, the electromagnetic radiation shield means may comprise electromagnetic radiation resin or rubber which is soft at normal temperature. While the skirt has been described with respect to the above embodiments in which the electrically conductive cloth has slits, the skirt elongated to wrap the cables passing therethrough is effective to reduce the outward emission of electromagnetic radiation from within the cabinet even if the electrically conductive cloth has no slits.

Figure 3:
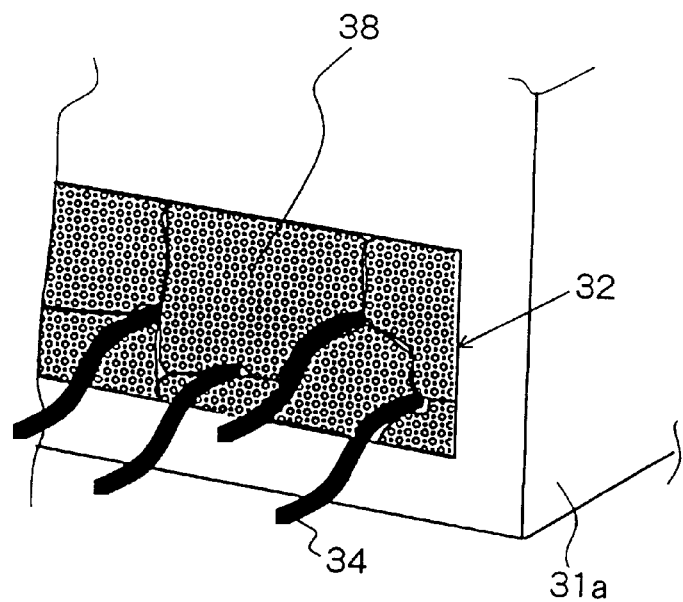
FIG. 3 is an enlarged fragmentary perspective view of an opening in an electronic device unit according to a fourth embodiment of the present invention.
Figure 4:
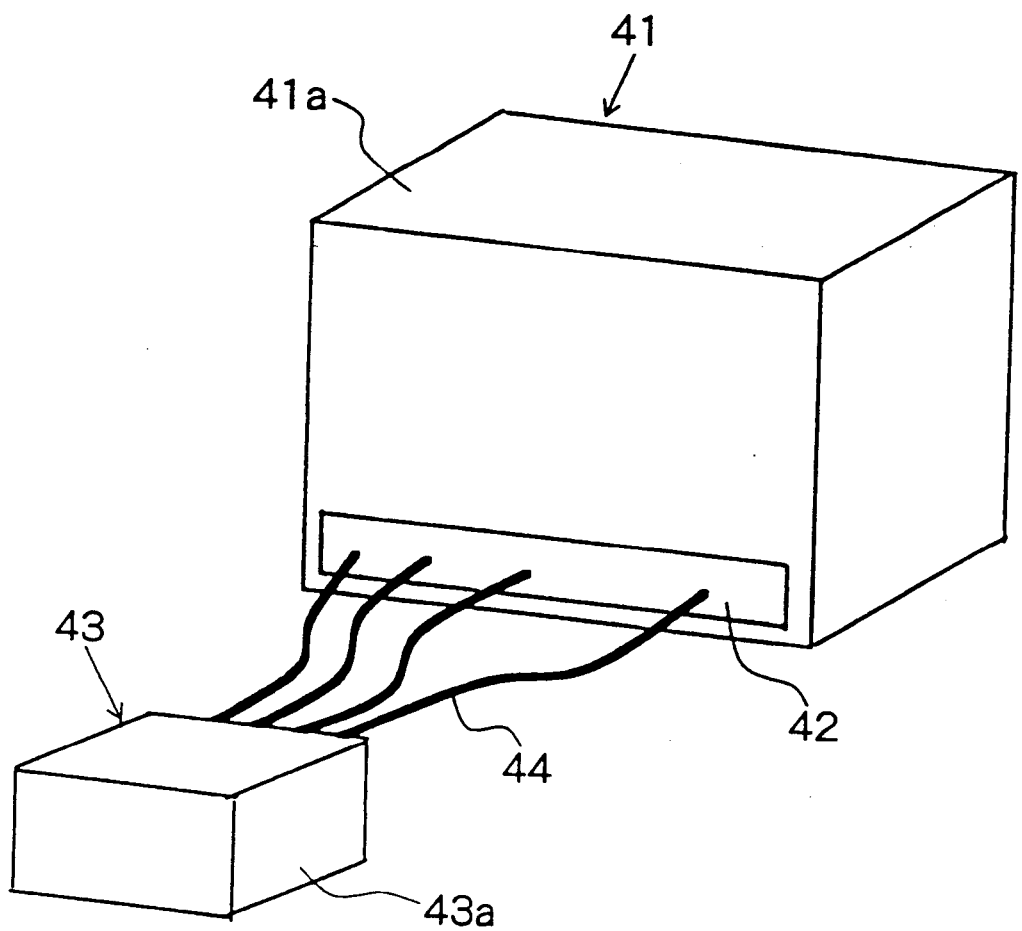
FIG. 4 is a schematic perspective view showing an electronic device unit, a peripheral, and a connected state therebetween, of a conventional electronic device.

FIG. 3 is an enlarged fragmentary perspective view of an opening in an electronic device unit according to a fourth embodiment of the present invention. The electronic device has a cabinet 31a has an opening 32, cables 34, and electrically conductive resin 38 which is plastic at normal temperature.

According to the fourth embodiment, the electromagnetic radiation shield means comprises electromagnetic radiation resin 38 which is plastic at normal temperature, filled in the space of the opening 32 through which the cables 34 extend. The electromagnetic radiation resin 38 which is sticky and plastic at normal temperature is filled in the form of a sheet in the space of the opening 32 through which the cables 34 extend, for thereby reducing electromagnetic radiation emitted from within the cabinet 31a through the opening 32. Since the filled material is plastic at normal temperature, it can easily be removed and filled again when the cables 34 are removed and installed.

The filled material may be rubber or fiber rather than resin insofar as it is electrically conductive and plastic at normal temperature.

The above embodiments have been described with respect of the opening in the cabinet of the electronic device unit. However, the present invention is also applicable to an opening in the cabinet of the peripheral for reducing electromagnetic radiation.

What is claimed is:

1. A method of reducing electromagnetic radiation emitted outwardly from an electronic device including an electronic device unit, a peripheral thereof, and a plurality of cables electrically interconnecting said electronic device unit and said peripheral, characterized by shielding a cabinet of said electronic device unit, a cabinet of said peripheral, and the cables, placing a soft cloth-like electromagnetic radiation shield in covering relation to an opening defined in said cabinet to allow said cables to be connected to terminals of said electronic device unit, and attaching said electromagnetic radiation shield in an electrically conductive fashion to said cabinet so as to be openable and closable with respect to said opening.

2. A method according to claim 1, wherein said cloth-like electromagnetic radiation shield has a plurality of vertical slits defined therein for passage of said cables therethrough, with a lower side of said electromagnetic radiation shield being a free end.

3. A method according to claim 2, wherein a plurality of said cloth-like electromagnetic radiation shields are superposed and attached.

4. A method according to claim 2, wherein the free end of said cloth-like electromagnetic radiation shield, which is divided by said slits, has a vertical length long enough to wrap said cables near portions thereof which pass through said slits.

5. A method according to claim 1, wherein said cloth-like electromagnetic radiation shield is made of electrically conductive fibers.

6. A method according to claim 1, wherein said cloth-like electromagnetic radiation shield is made of electrically conductive resin.

7. A method according to claim 1, wherein said cloth-like electromagnetic radiation shield is made of electrically conductive rubber.

8. A method according to claim 2, wherein said cloth-like electromagnetic radiation shield is made of electrically conductive fibers.

9. A method according to claim 3, wherein said cloth-like electromagnetic radiation shield is made of electrically conductive fibers.

10. A method according to claim 4, wherein said cloth-like electromagnetic radiation shield is made of electrically conductive fibers.

11. A method according to claim 2, wherein said cloth-like electromagnetic radiation shield is made of electrically conductive resin.

12. A method according to claim 3, wherein said cloth-like electromagnetic radiation shield is made of electrically conductive resin.

13. A method according to claim 4, wherein said cloth-like electromagnetic radiation shield is made of electrically conductive resin.

14. A method according to claim 2, wherein said cloth-like electromagnetic radiation shield is made of electrically conductive rubber.

15. A method according to claim 3, wherein said cloth-like electromagnetic radiation shield is made of electrically conductive rubber.

16. A method according to claim 4, wherein said cloth-like electromagnetic radiation shield is made of electrically conductive rubber.

17. A method of reducing electromagnetic radiation emitted outwardly from an electronic device including an electronic device unit, a peripheral thereof, and a plurality of cables electrically interconnecting said electronic device unit and said peripheral, characterized by shielding a cabinet of said electronic device unit, a cabinet of said peripheral, and the cables, and filling an electrically conductive material which is plastic at normal temperature in the form of a sheet in open cracks between said cables inserted in an opening defined in said cabinet to allow said cables to be connected to terminals of said electronic device and the cabinet surrounding said opening.

* * * * *